US009323147B2

(12) United States Patent
Lee et al.

(10) Patent No.: US 9,323,147 B2
(45) Date of Patent: Apr. 26, 2016

(54) POSITIVE PHOTOSENSITIVE RESIN COMPOSITION, PHOTOSENSITIVE RESIN FILM PREPARED BY USING THE SAME, AND DISPLAY DEVICE

(71) Applicant: SAMSUNG SDI CO., LTD., Yongin-si (KR)

(72) Inventors: Jong-Hwa Lee, Suwon-si (KR); Ji-Yun Kwon, Suwon-si (KR); Sang-Soo Kim, Suwon-si (KR); Kun-Bae Noh, Suwon-si (KR); Eun-Bi Park, Suwon-si (KR); Jae-Yeol Baek, Suwon-si (KR); Bum-Jin Lee, Suwon-si (KR); Sang-Haeng Lee, Suwon-si (KR); Eun-Ha Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 14/445,823

(22) Filed: Jul. 29, 2014

(65) Prior Publication Data
US 2015/0168835 A1   Jun. 18, 2015

(30) Foreign Application Priority Data

Dec. 12, 2013   (KR) ........................ 10-2013-0154834

(51) Int. Cl.
*G03F 7/023* (2006.01)
*G03F 7/26* (2006.01)
*G03F 7/004* (2006.01)
*G03F 7/022* (2006.01)

(52) U.S. Cl.
CPC ............. *G03F 7/0048* (2013.01); *G03F 7/0226* (2013.01); *G03F 7/0233* (2013.01); *G03F 7/26* (2013.01)

(58) Field of Classification Search
CPC ........ G03F 7/0226; G03F 7/0233; G03F 7/26
USPC ............................ 430/18, 191, 192, 193, 326
See application file for complete search history.

(56) References Cited

U.S. PATENT DOCUMENTS

| 2,797,213 | A | | 6/1957 | Moore |
| 3,669,658 | A | | 6/1972 | Yonezawa et al. |
| 6,383,708 | B1 | | 5/2002 | Uetani et al. |
| 7,214,455 | B2 | | 5/2007 | Miyoshi et al. |
| 7,803,510 | B2 | * | 9/2010 | Naiini et al. ................... 430/190 |
| 8,034,529 | B2 | * | 10/2011 | Sawabe ................. G03F 7/0236 430/165 |
| 2003/0010748 | A1 | * | 1/2003 | Kodama .................... C23F 1/02 216/41 |
| 2010/0092879 | A1 | * | 4/2010 | Minegishi et al. .............. 430/18 |
| 2013/0168859 | A1 | * | 7/2013 | Tanimoto et al. ............ 257/738 |

FOREIGN PATENT DOCUMENTS

| JP | 05-034919 A | 2/1993 |
| JP | 07-262383 A | 10/1995 |
| JP | 2004-054254 A | 2/2004 |
| KR | 10-0943375 A | 2/2005 |
| KR | 10-1227280 A | 3/2012 |
| TW | 201116930 | 5/2011 |

OTHER PUBLICATIONS

Search Report in counterpart Taiwanese Application No. 103127848 dated Jun. 23, 2015, pp. 1.

* cited by examiner

*Primary Examiner* — John S Chu
(74) *Attorney, Agent, or Firm* — Additon, Higgins & Pendleton, P.A.

(57) ABSTRACT

Disclosed are a photosensitive resin composition including (A) an alkali soluble resin; (B) a photosensitive diazoquinone compound; (C) a phenol compound; (D) a thermal acid generator; and (E) a solvent, wherein the solvent includes an organic solvent having a boiling point of less than about 160° C. under an atmospheric pressure and an organic solvent having a boiling point of greater than or equal to about 160° C. under an atmospheric pressure, wherein the organic solvent having a boiling point of less than about 160° C. is included in an amount of greater than or equal to about 90 wt % and less than about 100 wt % based on the total amount of the solvent, and the organic solvent having a boiling point of greater than or equal to about 160° C. is included in an amount of greater than about 0 wt % and less than or equal to about 10 wt % based on the total amount of the solvent, a photosensitive resin film using the same, and a display device.

9 Claims, No Drawings

POSITIVE PHOTOSENSITIVE RESIN COMPOSITION, PHOTOSENSITIVE RESIN FILM PREPARED BY USING THE SAME, AND DISPLAY DEVICE

CROSS-REFERENCE TO RELATED APPLICATION

This application claims priority to and the benefit of Korean Patent Application No. 10-2013-0154834 filed in the Korean Intellectual Property Office on Dec. 12, 2013, the entire disclosure of which is incorporated herein by reference.

FIELD OF THE INVENTION

This disclosure relates to a positive photosensitive resin composition, a photosensitive resin film using the same, and a display device including the photosensitive resin film.

BACKGROUND

Heat resistant resins such as polyimides, polybenzoxazoles, and the like have been widely used to form an interlayer insulating layer and/or a planarization layer for a display device such as an organic light emitting diode (OLED), liquid crystal display (LCD), and the like. In particular, heat resistant photosensitive polyimides and photosensitive polybenzoxazoles have recently been used to form an interlayer insulating layer and the like in an OLED in order to secure reliability of the OLED.

The photosensitive polyimide and polybenzoxazole can have excellent physical characteristics such as heat resistance, mechanical strength and the like, excellent electrical characteristics such as a low dielectric constant, a high insulation property, and the like, good planarization characteristics on a coating surface, include very small amounts of impurities that can deteriorate reliability of a device, and easily form a fine shape.

On the other hand, when the heat resistant resin is used to form the insulation layer, the planarization layer, or the like for an organic light emitting diode, a substrate on which the resin is coated is larger than the one used for a semiconductor, and spin-coating used for the semiconductor may not be adopted. Accordingly, slit-coating is generally adopted to coat the resin composition and form the insulation layer or planarization layer for an organic light emitting diode.

The slit coating is performed by using a slit nozzle and is applicable to a large substrate having a large area. Slit coating does not require spinning the substrate and thus decreases the amount of the resin composition compared with the conventional spin-coating. Slit coating is appropriately used for manufacturing a display device.

When a coating liquid ejected from the slit nozzle during the slit coating is coated on the substrate, the coated layer includes a large amount of a solvent and thus, is generally heated and dried on a hot plate and the like after removing the solvent at room temperature under a reduced pressure. Accordingly, it is important to select an appropriate solvent for the slit coating in preparation of the photosensitive resin composition including a polyimide precursor or a polybenzoxazole precursor and a photo sensitizer and used to form the insulation layer, planarization layer, and the like for an organic light emitting diode.

SUMMARY

One embodiment provides a positive photosensitive resin composition that can have an improved film residue ratio and sensitivity.

Another embodiment provides a photosensitive resin film using the positive photosensitive resin composition.

Yet another embodiment provides a display device including the photosensitive resin film.

One embodiment provides positive a photosensitive resin composition including (A) an alkali soluble resin; (B) a photosensitive diazoquinone compound; (C) a phenol compound; (D) a thermal acid generator; and (E) a solvent, wherein the solvent includes an organic solvent having a boiling point of less than about 160° C. under an atmospheric pressure and an organic solvent having a boiling point of greater than or equal to about 160° C. under an atmospheric pressure, wherein the composition includes the organic solvent having a boiling point of less than about 160° C. in an amount of greater than or equal to about 90 wt % and less than about 100 wt % based on the total amount of the solvent, and the organic solvent having a boiling point of greater than or equal to about 160° C. in an amount of greater than about 0 wt % and less than or equal to about 10 wt % based on the total amount of the solvent.

The solvent may include the organic solvent having a boiling point of less than about 160° C. under an atmospheric pressure and the organic solvent having a boiling point of greater than or equal to about 160° C. under an atmospheric pressure in a ratio of about 90:10 to about 99.5:0.5.

The solvent may include the organic solvent having a boiling point of less than about 160° C. under an atmospheric pressure and the organic solvent having a boiling point of greater than or equal to about 160° C. under an atmospheric pressure in a ratio of about 90:10 to about 95:5.

The solvent may include an organic solvent having a boiling point of greater than or equal to about 100° C. and less than about 160° C. and an organic solvent having a boiling point of greater than or equal to about 160° C. and less than 280° C.

The alkali soluble resin may be a polybenzoxazole precursor, a polyimide precursor, or a combination thereof.

The polybenzoxazole precursor may include a structural unit represented by the following Chemical Formula 1, and the polyimide precursor may include a structural unit represented by the following Chemical Formula 2.

[Chemical Formula 1]

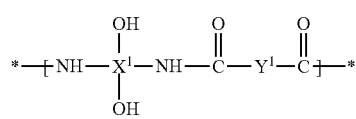

[Chemical Formula 2]

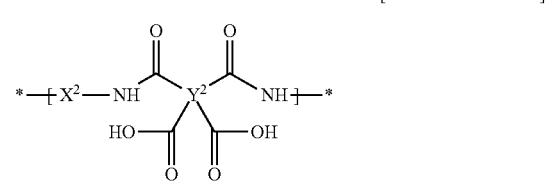

In the above Chemical Formulae 1 and 2, each $X^1$ is the same or different and each is independently a substituted or unsubstituted C6 to C30 aromatic organic group, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

The positive photosensitive resin composition may include about 5 to about 100 parts by weight of the photosensitive diazoquinone compound (B); about 1 to about 30 parts by weight of the phenol compound (C); about 1 to about 50 parts by weight of the thermal acid generator (D); and about 100 to about 2000 parts by weight of the solvent (E) based on about 100 parts by weight of the alkali soluble resin (A).

The positive photosensitive resin composition may further include an additive selected from a surfactant, a leveling agent, a silane coupling agent, and a combination thereof.

Another embodiment provides a photosensitive resin film formed using the positive photosensitive resin composition.

Yet another embodiment provides a display device including the photosensitive resin film.

The positive photosensitive resin composition according to one embodiment provides a photosensitive resin film that can have an improved film residue ratio and sensitivity.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one or more substituents including halogen (F, Br, Cl or I), a hydroxy group, a nitro group, a cyano group, an amino group ($NH_2$, $NH(R^{200})$ or $N(R^{201})(R^{202})$, wherein $R^{200}$, $R^{201}$ and $R^{202}$ are the same or different and are each independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination thereof, instead of a functional group of the present invention.

As used herein, when a specific definition is not otherwise provided, the term "alkyl" refers to C1 to C20 alkyl, for example C1 to C15 alkyl, the term "cycloalkyl" refers to C3 to C20 cycloalkyl, for example C3 to C18 cycloalkyl, the term "alkoxy" refers to C1 to C20 alkoxy, for example C1 to C18 alkoxy, the term "aryl" refers to C6 to C20 aryl, for example C6 to C18 aryl, the term "alkenyl" refers to C2 to C20 alkenyl, for example C2 to C18 alkenyl, the term "alkylene" refers to C1 to C30 alkylene, for example C1 to C18 alkylene, and the term "arylene" refers to C6 to C20 arylene, for example C6 to C16 arylene.

As used herein, when a specific definition is not otherwise provided, the term "aliphatic organic group" refers to C1 to C20 alkyl, C2 to C20 alkenyl, C2 to C20 alkynyl, C1 to C20 alkylene, C2 to C20 alkenylene, or C2 to C20 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C20 cycloalkyl, C3 to C20 cycloalkenyl, C3 to C20 cycloalkynyl, C3 to C20 cycloalkylene, C3 to C20 cycloalkenylene, or C3 to C20 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C20 aryl or C6 to C20 arylene, for example C6 to C16 aryl or C6 to C16 arylene, the term "heterocyclic group" refers to C2 to C20 cycloalkyl, C2 to C20 cycloalkylene, C2 to C20 cycloalkenyl, C2 to C20 cycloalkenylene, C2 to C20 cycloalkynyl, C2 to C20 cycloalkynylene, C2 to C20 heteroaryl, or C2 to C20 heteroarylene that include 1 to 3 hetero atoms including O, S, N, P, Si, or a combination thereof in a ring, for example C2 to C15 cycloalkyl, C2 to C15 cycloalkylene, C2 to C15 cycloalkenyl, C2 to C15 cycloalkenylene, C2 to C15 cycloalkynyl, C2 to C15 cycloalkynylene, C2 to C15 heteroaryl, or C2 to C15 heteroarylene that include 1 to 3 hetero atoms including O, S, N, P, Si, or a combination thereof in a ring.

As used herein, when a definition is not otherwise provided, the term "combination" refers to mixing or copolymerization. In addition, the term "copolymerization" refers to block copolymerization and/or random copolymerization, and the term "copolymer" refers to a block copolymer and/or a random copolymer.

As used herein, unless a specific definition is otherwise provided, a hydrogen atom is bonded at the position when a chemical bond is not drawn where a bond would otherwise appear.

Also, "*" refers to a linking part between the same or different atoms, or chemical formulae.

One embodiment provides a positive photosensitive resin composition that includes (A) an alkali soluble resin; (B) a photosensitive diazoquinone compound; (C) a phenol compound; (D) a thermal acid generator; and (E) a solvent, wherein the solvent includes an organic solvent having a boiling point of less than about 160° C. under an atmospheric pressure and an organic solvent having a boiling point of greater than or equal to about 160° C. under an atmospheric pressure, wherein the composition includes the organic solvent having a boiling point of less than about 160° C. in an amount of greater than or equal to about 90 wt % and less than about 100 wt % based on the total amount of the solvent, and the organic solvent having a boiling point of greater than or equal to about 160° C. in an amount of greater than about 0 wt % and less than or equal to about 10 wt % based on the total amount of the solvent.

The positive photosensitive resin composition according to one embodiment includes an organic solvent obtained by mixing a solvent having a low boiling point of less than 160° C. under an atmospheric pressure and another solvent having a high boiling point of greater than or equal to 160° C. under an atmospheric pressure in an appropriate ratio and provides a photosensitive resin film and the like that can have an excellent residue ratio and sensitivity.

The boiling point of the organic solvent under an atmospheric pressure is described in the Aldrich Handbook of Fine Chemical and Laboratory Equipment, and the boiling point of other organic solvents not described in the articles may be measured by using, for example, FP81HT/FP81C (Mettler Toledo International Inc.).

Hereinafter, each component is described in detail.

(E) Solvent

The positive photosensitive resin composition according to one embodiment includes a solvent being capable of easily dissolving each post-described component, for example an alkali soluble resin and the like.

As described above, the photosensitive resin composition used to form an insulation layer, a planarization layer, or the like for an organic light emitting diode is coated on a substrate having a large area, and the coating may not be performed in a slit coating method. When a solvent used for the composition has a high boiling point, there is a problem of deteriorating a film residue ratio, since a coated composition in a non-exposed region is easily washed away during development. Accordingly, a solvent having a low boiling point is generally used but has a problem of deteriorating sensitivity during pattern formation.

However, the composition according to one embodiment includes a solvent obtained by mixing a solvent having a low boiling point and a solvent having a high boiling point in an appropriate ratio, for example, in a ratio of about 90:10 to about 99.5:0.5 or about 90:10 to about 95:5 and thus, may increase a film residue ratio in a non-exposed region as well as have excellent sensitivity during pattern formation.

The positive photosensitive resin composition may include the solvent in an amount of about 100 to about 2000 parts by weight based on about 100 parts by weight of the alkali soluble resin. When the solvent is included in an amount within the above range, a coating layer may have a sufficient thickness, and excellent film residue ratio, sensitivity, solubility and coating property may be obtained.

(E-1) Organic Solvent Having a Boiling Point of Less than about 160° C. Under Atmospheric Pressure The composition according to one embodiment includes a solvent having a low boiling point, that is to say an organic solvent having a boiling point of less than about 160° C. under an atmospheric pressure in an amount of greater than or equal to about 90 wt %, for example greater than or equal to about 90 wt % and less than about 100 wt %, for example greater than or equal to about 95 wt % and less than about 100 wt % based on the total amount of the solvent. In some embodiments, the positive photosensitive resin composition may include the low boiling point solvent in an amount of about 90, 91, 92, 93, 94, 95, 96, 97, 98, 99, 99.1, 99.2, 99.3, 99.4, or 99.5 wt %. Further, according to some embodiments of the present invention, the amount of the low boiling point solvent can be in a range from about any of the foregoing amounts to about any other of the foregoing amounts.

When the organic solvent having a boiling point of less than about 160° C. under an atmospheric pressure is included in an amount outside of the above range, the solvent having a high boiling point is increased during drying under a reduced pressure after slit coating and does not easily escape but can remain in a coating layer. Thus, a non-exposed region can be easily washed away during development, which can decrease film residue ratio.

In addition, when the solvent having a high boiling point much remains during drying under a reduced pressure after slit coating, the solvent having excellent interaction with the alkali soluble resin surrounds the alkali soluble resin and weakens interaction of the alkali soluble resin with a photosensitive diazoquinone compound. In other words, the solvent having a high boiling point can strongly interact with the photosensitive diazoquinone compound as well as the alkali soluble resin and can hinder a bond between the alkali soluble resin and the photosensitive diazoquinone compound and thus can deteriorate a film residue ratio in a non-exposed region during development and developability with an alkali aqueous solution in an exposed region and resultantly, sensitivity.

When the amount of the solvent having a high boiling point, that is, the amount of a solvent having a boiling point of greater than or equal to 160° C. is increased under an atmospheric pressure, a film residue ratio and sensitivity may be further deteriorated.

The organic solvent having a boiling point of less than about 160° C. under an atmospheric pressure may be an organic solvent having a boiling point of greater than or equal to about 100° C. and less than about 160° C. under an atmospheric pressure.

The organic solvent having a boiling point of less than about 160° C. under an atmospheric pressure, for example a boiling point of greater than or equal to about 100° C. and less than about 160° C. under an atmospheric pressure may be dissolved in the alkali soluble resin. Examples of the solvent may include without limitation alkylene glycol mono alkyl ethers such as ethylene glycol monomethylether (boiling point 124° C.), propylene glycol monomethylether (boiling point 118° C.) and the like, alkyl acetates such as propyl acetate (boiling point 102° C.), butylacetate (boiling point 125° C.), isobutyl acetate (boiling point 118° C.) and the like, ketones such as methylethylketone (boiling point 79.6° C.), methyl propyl ketone (boiling point 102° C.), methyl butyl ketone (boiling point 127.6° C.), methyl iso butyl ketone (boiling point 116° C.), cyclopentanone (boiling point 130.6° C.) and the like, alcohols such as n-butylalcohol (boiling point 117° C.), isobutyl alcohol (boiling point 108° C.), isobutyl alcohol (boiling point 108° C.), ethyl lactate (boiling point 155° C.), pentan-1-ol (boiling point 138.5° C.), 3-methylbutan-1-ol (boiling point 131.2° C.), 4-methyl(methyl)-2-pentanol (boiling point 131.6° C.), aromatic hydrocarbons such as toluene, xylene, and the like, N,N-dimethyl formamide (boiling point 153° C.), and the like, and combinations thereof.

(E-2) Organic Solvent Having a Boiling Point of Greater than or Equal to about 160° C. Under an Atmospheric Pressure The composition according to one embodiment includes a solvent having a high boiling point, that is to say the organic solvent having a boiling point of greater than or equal to about 160° C. under an atmospheric pressure in an amount of less than or equal to about 10 wt %, for example greater than about 0 wt % and less than or equal to about 10 wt %, for example greater than or equal to about 0.5 wt % and less than or equal to about 10 wt %, for example, greater than or equal to about 5 wt % and less than or equal to about 10 wt %. In some embodiments, the positive photosensitive resin composition may include the high boiling point solvent in an amount of about 0.5, 0.6, 0.7, 0.8, 0.9, 1, 2, 3, 4, 5, 6, 7, 8, 9, or 10 wt %. Further, according to some embodiments of the present invention, the amount of the high boiling point solvent can be in a range from about any of the foregoing amounts to about any other of the foregoing amounts.

When the solvent having a high boiling point includes, for example, an organic solvent having a high boiling point of greater than or equal to about 160° C. under an atmospheric pressure is used in an amount within the above range, a photosensitive resin film may have increased uniformity and thus, suppress permeation of an alkali developing solution in a non-exposed region during development while it facilitates permeation of the alkali developing solution in an exposed region due to acid generated by the photosensitive diazoquinone compound.

In addition, among the solvents having a high boiling point, a solvent having a high boiling point and small compatibility with the alkali soluble resin may suppress decrease of a film residue and improve sensitivity. As described above, when the solvent having a high boiling point has good compatibility with the alkali soluble resin, and the alkali soluble resin is too well dissolved therein, the alkali soluble resin can have sharply decreased interaction with the photosensitive diazoquinone compound and can deteriorate film residue ratio in a non-exposed region but can generate a scum or a non-uniform pattern in an exposed region, since the alkali soluble resin is surrounded with the solvent having a high boiling point and thus, blocked from easy permeation of an alkali developing solution and from being washed away.

The organic solvent of greater than or equal to about 160° C. under an atmospheric pressure may be an organic solvent having a boiling point of greater than or equal to about 160° C. and less than about 300° C. under an atmospheric pressure boiling point.

The organic solvent of greater than or equal to about 160° C. under an atmospheric pressure, for example a boiling point of greater than or equal to about 160° C. and less than about 300° C. under an atmospheric pressure may be dissolved in the alkali soluble resin. Examples of the solvent may include without limitation N,N-dimethyl acetamide (boiling point 165° C.), diacetone alcohol (boiling point 166° C.), butyl lactate (boiling point 170° C.), diethylene glycol ethylmethyl ether (boiling point 179° C.), dimethyl sulfoxide (boiling point 189° C.), γ-butyl lactone (boiling point 204° C.), N-Methyl-2-pyrrolidone (boiling point 204° C.), diphenyl ether (boiling point 258° C.), N-cyclohexyl-2-pyrrolidone (boiling point 284° C.), and the like, and combinations thereof.

(A) Alkali Soluble Resin

The alkali soluble resin may be a polybenzoxazole precursor, a polyimide precursor, or a combination thereof. For example, the alkali soluble resin may be a polybenzoxazole precursor.

The polybenzoxazole precursor may include a structural unit represented by the following Chemical Formula 1, and the polyimide precursor may include a structural unit represented by the following Chemical Formula 2.

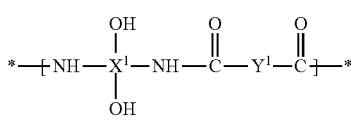

[Chemical Formula 1]

In the above Chemical Formula 1, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

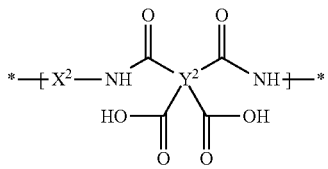

[Chemical Formula 2]

In the above Chemical Formula 2, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

In the above Chemical Formula 1, $X^1$ may be an aromatic organic group, and may be a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis (3-amino-4-hydroxyphenyl)propane, bis(4-amino-3-hydroxyphenyl)propane, bis (3-amino-4-hydroxyphenyl)sulfone, bis(4-amino-3-hydroxyphenyl)sulfone, 2,2-bis (3-amino-4-hydroxyphenyl)-1,1,1,3,3,3-hexafluoropropane, 2,2-bis (4-amino-3-hydroxyphenyl)-1,1,1,3,3,3-hexafluoropropane, 2,2-bis (3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl) hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane and 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may be a functional group represented by the following Chemical Formulae 3 and/or 4, but is not limited thereto.

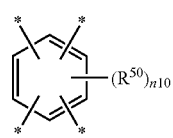

[Chemical Formula 3]

-continued

[Chemical Formula 4]

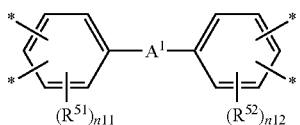

In the above Chemical Formulae 3 and 4, $A^1$ is a single bond, O, CO, $CR^{47}R^{48}$, $SO_2$ or S, wherein the $R^{47}$ and $R^{48}$ are the same or different and are each independently hydrogen or substituted or unsubstituted C1 to C30 alkyl, for example C1 to C30 fluoroalkyl, $R^{50}$ to $R^{52}$ are the same or different and are each independently hydrogen, substituted or unsubstituted C1 to C30 alkyl, a substituted or unsubstituted C1 to C30 carboxyl group, a hydroxy group, or a thiol group, n10 is an integer of 0 to 2, and n11 and n12 are the same or different and are each independently integer of 0 to 3.

In the above Chemical Formula 1, $Y^1$ may be an aromatic organic group, divalent to hexavalent aliphatic organic group, or a divalent to hexavalent alicyclic organic group, and may be a residual group of dicarboxylic acid or a residual group of a dicarboxylic acid derivative. For example, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like and combinations thereof.

Examples of $Y^1$ may be a functional group represented by the following Chemical Formulae 5 to 7, but are not limited thereto.

[Chemical Formula 5]

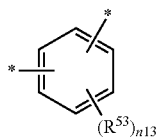

[Chemical Formula 6]

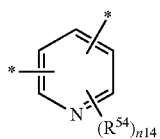

[Chemical Formula 7]

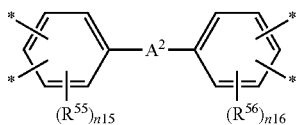

In the above Chemical Formulae 5 to 7, $R^{53}$ to $R^{56}$ are the same or different and are each independently hydrogen or substituted or unsubstituted C1 to C30 alkyl, n13 and n14 are the same or different and are each independently integers ranging from 0 to 4, n15 and n16 are the same or different and are each independently integers of 0 to 3, and $A^2$ is a single bond, O, $CR^{47} R^{48}$, CO, CONH, S or $SO_2$, wherein $R^{47}$ and $R^{48}$ are the same or different and are each independently hydrogen or substituted or unsubstituted C1 to C30 alkyl, for example C1 to C30 fluoroalkyl.

In the above Chemical Formula 2, $X^2$ may be an aromatic organic group, a divalent to hexavalent aliphatic organic group, or a divalent to hexavalent alicyclic organic group. In exemplary embodiments, $X^2$ may be an aromatic organic group or a divalent to hexavalent alicyclic organic group.

For example, $X^2$ may be a residual group derived from aromatic diamine, alicyclic diamine or silicon diamine. Herein, the aromatic diamine, alicyclic diamine and silicon diamine may be used singularly or in a mixture of one or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis[4-(4-aminophenoxyl)phenyl]sulfone, bis (3-aminophenoxyphenyl)sulfone, bis(4-aminophenoxy)biphenyl, bis[4-(4-aminophenoxyl)phenyl]ether, 1,4-bis(4-aminophenoxy)benzene, compounds substituted with alkyl group or a halogen in the aromatic ring, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl) tetramethyldisiloxane, bis(γ-aminopropyl) tetraphenyldisiloxane, 1,3-bis(aminopropyl) tetramethyldisiloxane, and the like, and combinations thereof.

In the above Chemical Formula 2, $Y^2$ may be an aromatic organic group, a quadrivalent to hexavalent aliphatic organic group, or a quadrivalent to hexavalent alicyclic organic group. For example, $Y^2$ may be an aromatic organic group or a quadrivalent to hexavalent alicyclic organic group.

The $Y^2$ may be a residual group derived from aromatic acid dianhydride, or alicyclic acid dianhydride. Herein, the aromatic acid dianhydride and the alicyclic acid dianhydride may be used singularly or in a mixture of one or more.

Examples of the aromatic acid dianhydride may include without limitation benzophenone tetracarboxylic dianhydride such as pyromellitic acid dianhydride; benzophenone-3,3',4,4'-tetracarboxylic dianhydride; oxydiphthalic acid dianhydride such as 4,4'-oxydiphthalic dianhydride; biphthalic dianhydrides such as 3,3',4,4'-biphthalic dianhydride; hexafluoroisopropyledene)diphthalic dianhydride such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutanetetracarboxylic dianhydride, 1,2,3,4-cyclopentanetetracarboxylic dianhydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The alkali soluble resin may include a thermally polymerizable functional group derived from a reactive end-capping monomer at at least one terminal end of branched chain of the alkali soluble resin. The reactive end-capping monomer may include monoamines including double bonds, monoanhydrides including double bonds, or a combination thereof. Examples of the monoamines may include without limitation toluidine, dimethylaniline, ethylaniline, aminophenol, aminobenzylalcohol, aminoindane, aminoacetonephenone, and the like, and combinations thereof.

The alkali soluble resin may have a weight average molecular weight (Mw) of about 3,000 to about 300,000 g/mol. When the weight average molecular weight is within the above range, sufficient properties may be obtained, and it may be easy to handle due to improved dissolution for an organic solvent.

(B) Photosensitive Diazoquinone Compound

The photosensitive diazoquinone compound may be a compound including a 1,2-benzoquinone diazide and/or 1,2-naphthoquinone diazide structure.

Examples of the photosensitive diazoquinone compound may include one or more of the compounds represented by the following Chemical Formulae 17 and 19 to 21, but are not limited thereto.

[Chemical Formula 17]

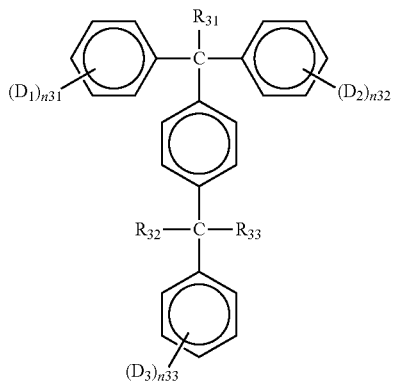

In the above Chemical Formula 17, $R_{31}$ to $R_{33}$ are the same or different and are each independently, hydrogen or substituted or unsubstituted alkyl, for example $CH_3$, $D_1$ to $D_3$ are the same or different and are each independently OQ, wherein Q is hydrogen, or the following Chemical Formula 18a or 18b, provided that all Qs are not simultaneously hydrogen, and n31 to n33 are the same or different and are each independently integers ranging from 1 to 3.

[Chemical Formula 18a]

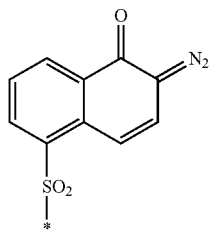

[Chemical Formula 18b]

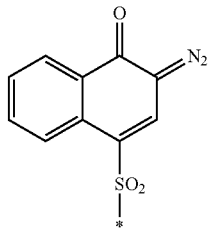

[Chemical Formula 19]

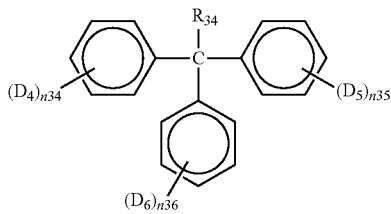

In the above Chemical Formula 19, $R_{34}$ is hydrogen or a substituted or unsubstituted alkyl, $D_4$ to $D_6$ are the same or different and are each independently OQ to wherein Q is the same as defined in the above Chemical Formula 17, and n34 to n36 are the same or different and are each independently integers ranging from 1 to 3.

[Chemical Formula 20]

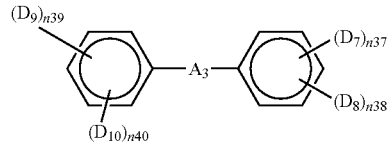

In the above Chemical Formula 20, $A_3$ is CO or CRR', wherein R and R' are the same or different and are each independently substituted or unsubstituted alkyl, $D_7$ to $D_{10}$ are the same or different and are each independently hydrogen, substituted or unsubstituted alkyl, OQ, or NHQ, wherein Q is the same as defined in the above Chemical Formula 17, n37, n38, n39 and n40 are the same or different and are each independently integers ranging from 1 to 4, and n37+n38 and n39+n40 are the same or different and are each independently integers of 5 or less, provided that at least one of $D_7$ to $D_{10}$ is OQ, and one aromatic ring includes one to three OQs and the other aromatic ring includes one to four OQs.

[Chemical Formula 21]

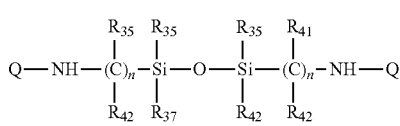

In the above Chemical Formula 21, $R_{35}$ to $R_{42}$ are the same or different and are each independently hydrogen or substituted or unsubstituted alkyl, n41 and n42 are the same or different and are each independently integers ranging from 1 to 5, for example 2 to 4, and Q is the same as defined in the above Chemical Formula 17.

The positive photosensitive resin composition may include the photosensitive diazoquinone compound in an amount of about 5 to about 100 parts by weight based on about 100 parts by weight of the alkali soluble resin. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed with minimal or no residue from exposure, and a film thickness loss during development can be prevented and thereby a good pattern can be provided.

(C) Phenol Compound

The phenol compound can increase a dissolution rate and sensitivity in an exposed region during development with an alkali aqueous solution and can promote patterning with a high resolution.

Examples of the phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

Examples of the phenol compound may be represented by the following Chemical Formulae 25 to 30, but is not limited thereto.

[Chemical Formula 25]

In the above Chemical Formula 25, $R_{91}$ to $R_{93}$ are the same or different and are each independently hydrogen or substituted or unsubstituted alkyl, $R_{94}$ to $R_{98}$ are the same or different and are each independently H, OH, or substituted or unsubstituted alkyl, for example $CH_3$, and n91 is an integer of 1 to 5.

[Chemical Formula 26]

In the above Chemical Formula 26, $R_{99}$ to $R_{104}$ are the same or different and are each independently H, OH, or substituted or unsubstituted alkyl, $A_4$ is CR'R" or a single bond, wherein R' and R" are the same or different and are each independently hydrogen or substituted or unsubstituted alkyl, for example $CH_3$, and n92+n93+n94 and n95+n96+n97 are the same or different and are each independently integers of less than or equal to 5.

[Chemical Formula 27]

In the above Chemical Formula 27, $R_{105}$ to $R_{107}$ are the same or different and are each independently hydrogen or substituted or unsubstituted alkyl, n98, n99 and n102 are the same or different and are each independently integers ranging from 1 to 5, and n100 and n101 are the same or different and are each independently integers ranging from 0 to 4.

[Chemical Formula 28]

In the above Chemical Formula 28, $R_{108}$ to $R_{113}$ are the same or different and are each independently hydrogen, OH, or substituted or unsubstituted alkyl, and n103 to n106 are the same or different and are each independently integers of 1 to 4, provided that n103+n105 and n104+n106 are independently integers of 5 or less.

[Chemical Formula 29]

In the above Chemical Formula 29, $R_{114}$ is substituted or unsubstituted alkyl, for example $CH_3$, $R_{115}$ to $R_{117}$ are the same or different and are each independently hydrogen or substituted or unsubstituted alkyl, n107, n109 and n111 are the same or different and are each independently integers ranging from 1 to 5, n108, n110 and n112 are the same or different and are each independently integers ranging from 0 to 4, provided that n107+n108, n109+n110 and n111+n112 are independently integers of 5 or less.

[Chemical Formula 30]

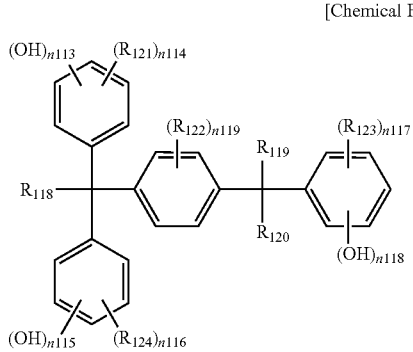

In the above Chemical Formula 30, $R_{118}$ to $R_{120}$ are the same or different and are each independently substituted or unsubstituted alkyl, for example $CH_3$, $R_{121}$ to $R_{124}$ are the same or different and are each independently hydrogen or substituted or unsubstituted alkyl, n113, n115 and n118 are the same or different and are each independently integers ranging from 1 to 5, n114, n116 and n117 are the same or different and are each independently integers ranging from 0 to 4, and n119 is an integer ranging from 1 to 4, provided that n113+n114, n115+n116 and n117+n118 are independently integers of 5 or less.

The positive photosensitive resin composition may include the phenol compound in an amount of about 1 to about 30 parts by weight based on about 100 parts by weight of the alkali soluble resin. In some embodiments, the positive photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the phenol compound can be in a range from about any of the foregoing amounts to about any other of the foregoing amounts.

When the phenol compound is included in an amount within the above range, the phenol compound may play a role of increasing a dissolution rate and sensitivity in an exposed region during development with an alkali aqueous solution and patterning with high resolution without a development scum during development.

(D) Thermal Acid Generator

A thermal acid generator used in the present invention is thermally decomposed and generates acid and may be any conventional thermal acid generator, for example, a thermal acid generator having a thermal decomposition temperature of about 120° C. to about 200° C.

When the thermal acid generator has a thermal decomposition temperature within the above range, an out gas decrease effect and excellent reliability may be obtained.

The thermal acid generator in the present invention may be, for example a compound represented by the following Chemical Formula 36, Chemical Formula 37, or a combination thereof.

[Chemical Formula 36]

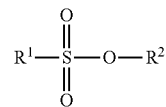

[Chemical Formula 37]

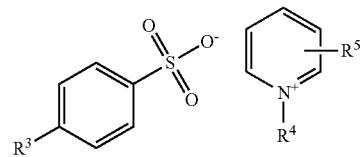

In the above Chemical Formulae 36 and 37, $R^1$ is hydrogen, substituted or unsubstituted C1 to C30 alkoxy, substituted or unsubstituted C6 to C30 aryl, or a combination thereof, $R^2$ is hydrogen, substituted or unsubstituted C1 to C30 alkyl, substituted or unsubstituted C2 to C30 alkenyl, substituted or unsubstituted C1 to C30 alkynyl, or a combination thereof, $R^3$ is hydrogen, substituted or unsubstituted C1 to C30 alkyl, substituted or unsubstituted C1 to C30 alkoxy, or a combination thereof, $R^4$ is hydrogen, substituted or unsubstituted C1 to C30 alkyl, or a combination thereof, and $R^5$ is hydrogen, halogen, substituted or unsubstituted C1 to C30 alkyl, or a combination thereof.

The above Chemical Formula 36 may be represented by one or more selected from the following Chemical Formulae 36a to 36c.

[Chemical Formula 36a]

[Chemical Formula 36b]

[Chemical Formula 36c]

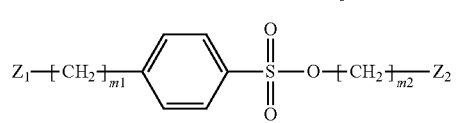

In the above Chemical Formulae 36a to 36c, m1 to m4 are the same or different and are each independently an integer ranging from 0 to 10, for example 0 to 6, and $Z_1$ to $Z^4$ are the same or different and are each independently hydrogen, halogen, a hydroxy group, substituted or unsubstituted C1 to C30 alkyl, substituted or unsubstituted C2 to C30 alkenyl, substituted or unsubstituted C1 to C30 alkynyl, substituted or unsubstituted C1 to C30 alkoxy, substituted or unsubstituted C6 to C30 aryl, or a combination thereof.

The above Chemical Formulae 36 and/or 37 may be represented by one of the following Chemical Formulae 38 to 44.

[Chemical Formula 38]

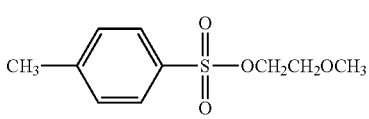

[Chemical Formula 39]

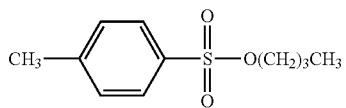

[Chemical Formula 40]

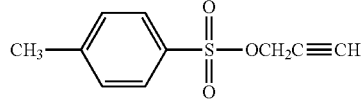

[Chemical Formula 41]

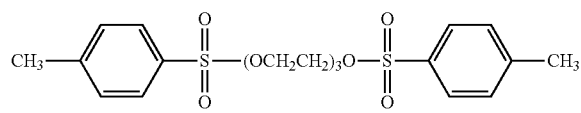

[Chemical Formula 42]

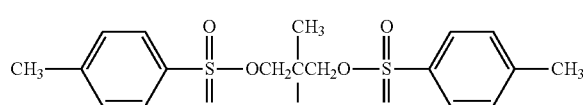

[Chemical Formula 43]

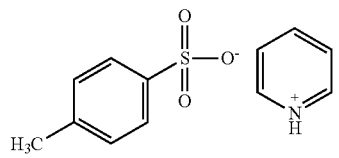

[Chemical Formula 44]

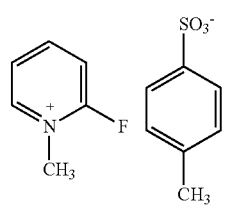

One or more of the compounds represented by the following Chemical Formulae 45 to 48 may be used as a thermal acid generator.

[Chemical Formula 45]

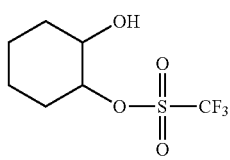

[Chemical Formula 46]

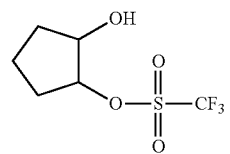

[Chemical Formula 47]

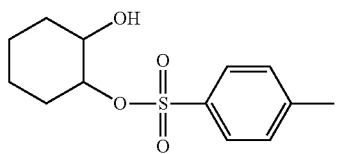

[Chemical Formula 48]

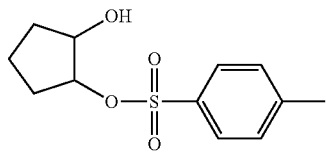

The positive photosensitive resin composition may include the thermal acid generator in an amount of about 1 to about 50 parts by weight, for example about 3 to about 30 parts by weight, based on about 100 parts by weight of the alkali soluble resin. In some embodiments, the positive photosensitive resin composition may include the thermal acid generator in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the thermal acid generator can be in a range from about any of the foregoing amounts to about any other of the foregoing amounts.

When the thermal acid generator is included in an amount within the above range, the polybenzoxazole precursor may have sufficient ring closure, a manufactured insulation layer may have excellent thermal and mechanical characteristics, and the composition may also have excellent storage stability.

The thermal acid generator may be selected depending on a thermal temperature and used as one kind alone or a mixture of two or more.

Allylsulfonic acid such as p-toluene sulfonic acid, benzenesulfonic acid, perfluoroalkyl sulfonic acid such as trifluoromethanesulfonic acid, fluorobutanesulfonic acid, and alkyl sulfonic acid such as methane sulfonic acid, ethane sulfonic acid, butane sulfonic acid may be also used, singly or in combination, in addition to or as an alternative to the thermal acid generator.

(F) Other Additive(s)

The positive photosensitive resin composition according to one embodiment may further include one or more other additives.

The other additive may include a suitable surfactant and/or leveling agent to prevent a stain of the film and/or to improve the development. In addition, a silane coupling agent may be used as an adherence promoting agent in order to improve adherence with a substrate.

The surfactant, the leveling agent, and the silane coupling agent may be used singularly or in a mixture thereof.

The surfactant may include a siloxane-based surfactant and/or a fluorine atom-containing surfactant, and the surfactant may be included in an amount of about 0.005 parts by weight to about 0.3 parts by weight based on about 100 parts by weight of the photosensitive resin composition. When the surfactant is included in an amount within the above range, generation of a stain may be minimized, and film uniformity may be improved.

Examples of the siloxane-based surfactant may include without limitation one or more of the BYK series made by German BYK Additives & Instruments, and examples of the fluorine atom-containing surfactant may include without limitation one or more of the Mega Face series made by Dainippon Ink & Chemicals Inc. and the like, but are not limited thereto.

The process for forming a pattern using the positive photosensitive resin composition according to one embodiment includes coating the positive photosensitive resin composition on a supporting substrate using spin coating, slit coating, inkjet printing, and the like; drying the coated positive photosensitive resin composition to form a positive photosensitive resin composition layer; exposing the positive photosensitive resin composition layer; developing the positive photosensitive resin composition layer in an alkali aqueous solution to provide a photosensitive resin film; and heating the photosensitive resin film. The conditions of processes to provide a pattern are widely known in this art, so detailed descriptions thereof will be omitted in this specification.

According to another embodiment of the present invention, a photosensitive resin film manufactured using the positive photosensitive resin composition is provided.

The photosensitive resin film may be used as an organic insulation layer, a buffer layer, and/or a protective layer.

According to further embodiment, a display device including the photosensitive resin film is provided.

The display device may be an organic light emitting diode (OLED) and/or a liquid crystal display (LCD).

That is to say, the positive photosensitive resin composition according to one embodiment may be applied to an organic insulation layer, a passivation layer, and/or an insulation interlayer in a display device.

Hereinafter, the present invention is illustrated in more detail with reference to the following examples and comparative examples. However, the following examples are exemplary only and the present invention is not limited thereto.

SYNTHESIS EXAMPLES

Synthesis Example 1

Synthesis of Polybenzoxazole Precursor (PA-1)

17.4 of 2,2-bis(3-amino-4-hydroxyphenyl)-1,1,1,3,3,3-hexafluoropropane and 0.86 g of 1,3-bis(aminopropyl)tetramethyldisiloxane are put in a four-necked flask equipped with an agitator, a temperature controller, a nitrogen gas injector and a cooler while nitrogen is passed through the flask, and 280 g of N-methyl-2-pyrrolidone (NMP) is added thereto to dissolve them. Herein, the obtained solution has a solid content of 9 wt %.

When the solid is completely dissolved, 9.9 g of pyridine is added to the solution, and another solution obtained by dissolving 13.3 g of 4,4'-oxydibenzonyl chloride in 142 g of N-methyl-2-pyrrolidone (NMP) is slowly added thereto in a dropwise fashion for 30 minutes while its temperature is maintained at 0 to 5° C. After the addition in a dropwise fashion, the mixture is reacted at 0 to 5° C. for one hour and then, for one hour more after increasing its temperature to room temperature.

Subsequently, 1.6 g of 5-norbornene-2,3-dicarboxyl anhydride is added to the resultant, and the mixture is agitated at room temperature for 2 hours, completing the reaction. The reaction mixture is added to a solution of water/methanol (a volume ratio=10/1) to produce a precipitate, and the precipitate is filtered, sufficiently washed with water, and dried at 80° C. under vacuum for 24 hours, obtaining a polybenzoxazole precursor (PA-1).

Synthesis Example 2

Synthesis of Polybenzoxazole Precursor (PA-2)

A polybenzoxazole precursor (PA-2) is manufactured according to the same method as Synthesis Example 3 except for using maleic anhydride instead of the 5-norbornene-2,3-dicarboxyl anhydride.

Synthesis Example 3

Synthesis of Polybenzoxazole Precursor (PA-3)

A polybenzoxazole precursor PA-3 is manufactured according to the same method as Synthesis Example 3 except for using aconitic anhydride instead of the 5-norbornene-2,3-dicarboxyl anhydride.

Preparation of Positive Photosensitive Resin Composition

Example 1

A positive photosensitive resin composition is obtained by dissolving 15 g of the polybenzoxazole precursor (PA-1) synthesized according to Synthesis Example 1, 5.31 g of a photosensitive diazoquinone represented by the following Chemical Formula A, 3.75 g of a phenol compound represented by the following Chemical Formula B and 0.75 g of a thermal acid generator represented by Chemical Formula 38 in 141.687 g of propylene glycol monomethylether (a boiling point of 118° C.), 57.496 g of ethyl lactate (a boiling point of 158° C.), 6.160 g of γ-butyl lactone (a boiling point of 205° C.) and adding 0.037 g of a fluorine-based a leveling agent F-554 thereto, and filtering the mixture with a 0.45 μm fluoro resin filter.

[Chemical Formula A]

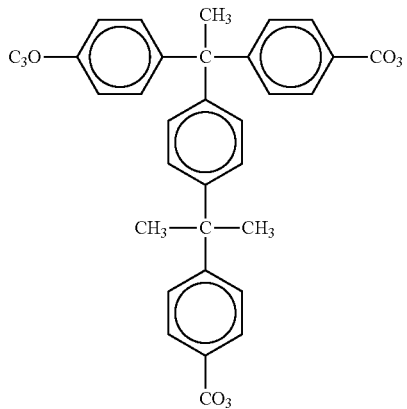

In the above Chemical Formula, two of $Q_1$ to $Q_3$ are

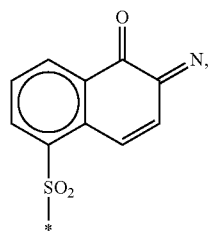

and the remaining one is hydrogen.

[Chemical Formula B]

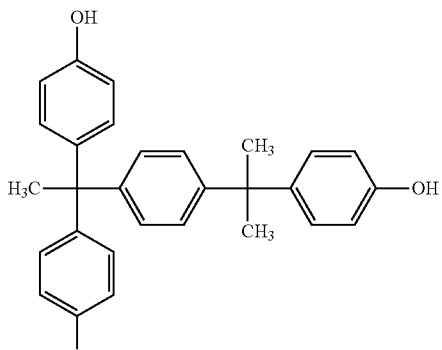

[Chemical Formula 38]

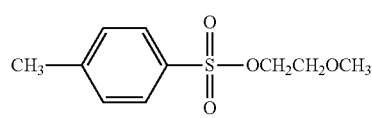

Example 2

A positive photosensitive resin composition is manufactured according to the same method as Example 1 except for using the polybenzoxazole precursor (PA-2) of Synthesis Example 2 instead of 15 g of the polybenzoxazole precursor (PA-1) of Synthesis Example 1.

Example 3

A positive photosensitive resin composition is was manufactured according to the same method as Example 1 except for using the polybenzoxazole precursor (PA-3) of Synthesis Example 3 instead of 15 g of the polybenzoxazole precursor (PA-1) of Synthesis Example 1.

Example 4

A positive photosensitive resin composition is manufactured according to the same method as Example 1 except for changing the solvent composition of Example 1 to 0 g of propylene glycol monomethylether (a boiling point of 118° C.), 195.076 g of ethyl lactate (a boiling point of 158° C.), and 10.267 g of γ-butyl lactone (a boiling point of 205° C.).

Example 5

A positive photosensitive resin composition is manufactured according to the same method as Example 4 except for using the polybenzoxazole precursor (PA-2) of Synthesis Example 2 instead of 15 g of the polybenzoxazole precursor (PA-1) in Example 4.

Example 6

A positive photosensitive resin composition is manufactured according to the same method as Example 4 except for using the polybenzoxazole precursor (PA-3) of Synthesis Example 3 instead of 15 g of the polybenzoxazole precursor (PA-1) in Example 4.

Example 7

A positive photosensitive resin composition is manufactured according to the same method as Example 1 except for changing the solvent composition of Example 1 to 102.672 g of propylene glycol monomethylether (a boiling point of 118° C.), 92.405 g of ethyl lactate (a boiling point of 158° C.), and 10.267 g of γ-butyl lactone (a boiling point of 205° C.).

Example 8

A positive photosensitive resin composition is manufactured according to the same method as Example 4 except for using the polybenzoxazole precursor (PA-2) of Synthesis Example 2 instead of 15 g of the polybenzoxazole precursor (PA-1) in Example 7.

Example 9

A positive photosensitive resin composition is manufactured according to the same method as Example 4 except for using the polybenzoxazole precursor (PA-3) of Synthesis Example 3 instead of 15 g of the polybenzoxazole precursor (PA-1) in Example 7.

Example 10

A positive photosensitive resin composition is manufactured according to the same method as Example 1 except for changing the solvent composition of Example 1 to 82.137 g of propylene glycol monomethylether (a boiling point of 118° C.), 112.939 g of ethyl lactate (a boiling point of 158° C.), and 10.267 g of diphenylether (a boiling point of 258° C.).

Example 11

A positive photosensitive resin composition is manufactured according to the same method as Example 10 except for using the polybenzoxazole precursor (PA-2) of Synthesis Example 2 instead of 15 g of the polybenzoxazole precursor (PA-1).

Example 12

A positive photosensitive resin composition is manufactured according to the same method as Example 10 except for using the polybenzoxazole precursor (PA-3) of Synthesis Example 3 instead of 15 g of the polybenzoxazole precursor (PA-1).

Example 13

A positive photosensitive resin composition is manufactured according to the same method as Example 1 except for changing the solvent composition of Example 10 to 0 g of propylene glycol monomethylether (a boiling point of 118° C.), 195.076 g of ethyl lactate (boiling point of 158° C.), and 10.267 g of diphenylether (a boiling point of 258° C.).

Example 14

A positive photosensitive resin composition is manufactured according to the same method as Example 13 except for using the polybenzoxazole precursor (PA-2) of Synthesis Example 2 instead of 15 g of the polybenzoxazole precursor (PA-1).

Example 15

A positive photosensitive resin composition is manufactured according to the same method as Example 13 except for using the polybenzoxazole precursor (PA-3) of Synthesis Example 3 instead of 15 g of the polybenzoxazole precursor (PA-1).

Example 16

A positive photosensitive resin composition is manufactured according to the same method as Example 1 except for changing the solvent composition of Example 10 to 102.672 g of propylene glycol monomethylether (a boiling point of 118° C.), 92.405 g of ethyl lactate (a boiling point of 158° C.), and 10.267 g of diphenylether (a boiling point of 258° C.).

Example 17

The positive photosensitive resin composition is manufactured according to the same method as Example 16 except for using the polybenzoxazole precursor (PA-2) of Synthesis Example 2 instead of 15 g of the polybenzoxazole precursor (PA-1).

Example 18

The positive photosensitive resin composition is manufactured according to the same method as Example 16 except for using the polybenzoxazole precursor (PA-3) of Synthesis Example 3 instead of 15 g of the polybenzoxazole precursor (PA-1).

Example 19

A positive photosensitive resin composition is manufactured according to the same method as Example 1 except for changing the solvent composition of Example 1 to 130.12 g of methylethylketone (a boiling point of 79.6° C.), 52.93 g of ethyl lactate (a boiling point of 158° C.), and 9.45 g of dimethyl sulfoxide (a boiling point of 189° C.).

Example 20

The positive photosensitive resin composition is manufactured according to the same method as Example 19 except for using the polybenzoxazole precursor (PA-2) of Synthesis Example 2 instead of 15 g of the polybenzoxazole precursor (PA-1).

Example 21

The positive photosensitive resin composition is manufactured according to the same method as Example 19 except for using the polybenzoxazole precursor (PA-3) of Synthesis Example 3 instead of 15 g of the polybenzoxazole precursor (PA-1).

Example 22

A positive photosensitive resin composition is manufactured according to the same method as Example 1 except for changing the solvent composition of Example 1 to 182.86 g of methylethylketone (a boiling point of 79.6° C.), 0 g of ethyl lactate (a boiling point of 158° C.), and 9.64 g of dimethyl sulfoxide (a boiling point of 189° C.).

Example 23

A positive photosensitive resin composition is manufactured according to the same method as Example 22 except for using the polybenzoxazole precursor (PA-2) of Synthesis Example 2 instead of 15 g of the polybenzoxazole precursor (PA-1).

Example 24

A positive photosensitive resin composition is manufactured according to the same method as Example 22 except for using the polybenzoxazole precursor (PA-3) of Synthesis Example 3 instead of 15 g of the polybenzoxazole precursor (PA-1).

Example 25

A positive photosensitive resin composition is manufactured according to the same method as Example 1 except for changing the solvent composition of Example 1 to 96.24 g of methylethylketone (a boiling point of 79.6° C.), 86.62 g of ethyl lactate (a boiling point of 158° C.), and 9.64 g of dimethyl sulfoxide (a boiling point of 189° C.).

Example 26

A positive photosensitive resin composition is manufactured according to the same method as Example 22 except for using the polybenzoxazole precursor (PA-2) of Synthesis Example 2 instead of 15 g of the polybenzoxazole precursor (PA-1).

Example 27

A positive photosensitive resin composition is manufactured according to the same method as Example 22 except for using the polybenzoxazole precursor (PA-3) of Synthesis Example 3 instead of 15 g of the polybenzoxazole precursor (PA-1).

Comparative Example 1

A positive photosensitive resin composition is manufactured according to the same method as Example 1 except for changing the solvent composition of Example 1 to 134.65 g of propylene glycol monomethylether (a boiling point of 118° C.), 38.56 g of ethyl lactate (a boiling point of 158° C.), and 19.28 g of γ-butyl lactone (a boiling point of 205° C.).

Comparative Example 2

A positive photosensitive resin composition is manufactured according to the same method as Comparative Example 1 except for using the polybenzoxazole precursor (PA-2) of Synthesis Example 2 instead of 15 g of the polybenzoxazole precursor (PA-1) in Comparative Example 1.

Comparative Example 3

A positive photosensitive resin composition is manufactured according to the same method as Comparative Example 1 except for using the polybenzoxazole precursor (PA-3) of Synthesis Example 3 instead of 15 g of the polybenzoxazole precursor (PA-1) in Comparative Example 1.

Comparative Example 4

A positive photosensitive resin composition is manufactured according to the same method as Example 1 except for changing the solvent composition of Example 1 to 164.275 g of propylene glycol monomethylether (PGME, 118° C.), 0 g of ethyl lactate (EL, a boiling point of 158° C.), and 41.069 g of γ-butyl lactone (GBL, a boiling point of 205° C.).

Comparative Example 5

A positive photosensitive resin composition is manufactured according to the same method as Comparative Example 4 except for using the polybenzoxazole precursor (PA-2) of Synthesis Example 2 instead of 15 g of the polybenzoxazole precursor (PA-1) in Comparative Example 4.

Comparative Example 6

A positive photosensitive resin composition is manufactured according to the same method as Comparative Example 4 except for using the polybenzoxazole precursor (PA-3) of Synthesis Example 3 instead of 15 g of the polybenzoxazole precursor (PA-1) in Comparative Example 4.

Comparative Example 7

A positive photosensitive resin composition is manufactured according to the same method as Example 1 except for changing the solvent composition of Example 1 to 143.741 g of propylene glycol monomethylether (PGME, 118° C.), 20.534 g of ethyl lactate (EL, a boiling point of 158° C.), and 41.069 g of γ-butyl lactone (GBL, a boiling point of 205° C.).

Comparative Example 8

A positive photosensitive resin composition is manufactured according to the same method as Comparative Example 7 except for using the polybenzoxazole precursor (PA-2) of Synthesis Example 2 instead of 15 g of the polybenzoxazole precursor (PA-1) in Comparative Example 7.

Comparative Example 9

A positive photosensitive resin composition is manufactured according to the same method as Comparative Example 7 except for using the polybenzoxazole precursor (PA-3) of Synthesis Example 3 instead of 15 g of the polybenzoxazole precursor (PA-1) in Comparative Example 7.

A kind of polybenzoxazole precursor and solvent used to manufacture the photosensitive resin composition according to Examples 1 to 27 and Comparative Examples 1 to 9 and the amount of the solvent are provided in the following Table 1.

TABLE 1

(unit: wt %)

| | Polybenzoxazole precursor | Solvent (based on 100 wt % of solvent) | | | | | |
|---|---|---|---|---|---|---|---|
| | | propylene glycol monomethylether | ethyl lactate | γ-butyl lactone | diphenyl ether | methylethyl ketone | dimethyl sulfoxide |
| Ex. 1 | PA-1 | 69 | 28 | 3 | 0 | 0 | 0 |
| Ex. 2 | PA-2 | 69 | 28 | 3 | 0 | 0 | 0 |
| Ex. 3 | PA-3 | 69 | 28 | 3 | 0 | 0 | 0 |
| Ex. 4 | PA-1 | 0 | 95 | 5 | 0 | 0 | 0 |
| Ex. 5 | PA-2 | 0 | 95 | 5 | 0 | 0 | 0 |
| Ex. 6 | PA-3 | 0 | 95 | 5 | 0 | 0 | 0 |
| Ex. 7 | PA-1 | 50 | 45 | 5 | 0 | 0 | 0 |
| Ex. 8 | PA-2 | 50 | 45 | 5 | 0 | 0 | 0 |
| Ex. 9 | PA-3 | 50 | 45 | 5 | 0 | 0 | 0 |
| Ex. 10 | PA-1 | 40 | 55 | 0 | 5 | 0 | 0 |
| Ex. 11 | PA-2 | 40 | 55 | 0 | 5 | 0 | 0 |
| Ex. 12 | PA-3 | 40 | 55 | 0 | 5 | 0 | 0 |
| Ex. 13 | PA-1 | 0 | 95 | 0 | 5 | 0 | 0 |
| Ex. 14 | PA-2 | 0 | 95 | 0 | 5 | 0 | 0 |
| Ex. 15 | PA-3 | 0 | 95 | 0 | 5 | 0 | 0 |
| Ex. 16 | PA-1 | 50 | 45 | 0 | 5 | 0 | 0 |
| Ex. 17 | PA-2 | 50 | 45 | 0 | 5 | 0 | 0 |
| Ex. 18 | PA-3 | 50 | 45 | 0 | 5 | 0 | 0 |
| Ex. 19 | PA-1 | 0 | 27 | 0 | 0 | 68 | 5 |
| Ex. 20 | PA-2 | 0 | 27 | 0 | 0 | 68 | 5 |
| Ex. 21 | PA-3 | 0 | 27 | 0 | 0 | 68 | 5 |
| Ex. 22 | PA-1 | 0 | 0 | 0 | 0 | 95 | 5 |
| Ex. 23 | PA-2 | 0 | 0 | 0 | 0 | 95 | 5 |
| Ex. 24 | PA-3 | 0 | 0 | 0 | 0 | 95 | 5 |
| Ex. 25 | PA-1 | 0 | 45 | 0 | 0 | 50 | 5 |
| Ex. 26 | PA-2 | 0 | 45 | 0 | 0 | 50 | 5 |
| Ex. 27 | PA-3 | 0 | 45 | 0 | 0 | 50 | 5 |
| Comp. Ex. 1 | PA-1 | 69.96 | 20.03 | 10.01 | 0 | 0 | 0 |
| Comp. Ex. 2 | PA-2 | 69.96 | 20.03 | 10.01 | 0 | 0 | 0 |
| Comp. Ex. 3 | PA-3 | 69.96 | 20.03 | 10.01 | 0 | 0 | 0 |
| Comp. Ex. 4 | PA-1 | 80 | 0 | 20 | 0 | 0 | 0 |
| Comp. Ex. 5 | PA-2 | 80 | 0 | 20 | 0 | 0 | 0 |
| Comp. Ex. 6 | PA-3 | 80 | 0 | 20 | 0 | 0 | 0 |
| Comp. Ex. 7 | PA-1 | 70 | 10 | 20 | 0 | 0 | 0 |

TABLE 1-continued

| | | Solvent (based on 100 wt % of solvent) (unit: wt %) | | | | | |
|---|---|---|---|---|---|---|---|
| | Poly-benzoxazole precursor | propylene glycol monomethylether | ethyl lactate | γ-butyl lactone | diphenyl ether | methylethyl ketone | dimethyl sulfoxide |
| Comp. Ex. 8 | PA-2 | 70 | 10 | 20 | 0 | 0 | 0 |
| Comp. Ex. 9 | PA-3 | 70 | 10 | 20 | 0 | 0 | 0 |

Evaluation: Film Residue Ratio, Sensitivity and Film Shrinkage Ratio

The photosensitive resin compositions according to Examples 1 to 27 and Comparative Examples 1 to 9 are respectively coated on an ITO-patterned glass substrate in a method of slit coating and the like and dried at 120° C. for 100 seconds on a hot plate after removing a solvent therein under a reduced pressure to form a 4.15 µm-thick coating layer. Subsequently, the pattern is exposed by using a broad-band exposer and developed. Subsequently, the pattern is cured at 250° C. under a nitrogen stream.

In the exposure/development process, a film residue ratio and sensitivity are evaluated, and a scum on the pattern is examined. After the curing, a film shrinkage ratio is evaluated, and the results are provided in the following Table 2.

TABLE 2

| | Exposure/development | | Curing at 250° C. |
|---|---|---|---|
| | Film residue ratio (%) | Sensitivity (mJ/cm$^2$) | film shrinkage ratio (%) |
| Example 1 | 91 | 110 | 15 |
| Example 2 | 92 | 105 | 16 |
| Example 3 | 88 | 96 | 18 |
| Example 4 | 84 | 115 | 16 |
| Example 5 | 85 | 120 | 16 |
| Example 6 | 85 | 124 | 16 |
| Example 7 | 88 | 130 | 16 |
| Example 8 | 88 | 132 | 16 |
| Example 9 | 88 | 125 | 16 |
| Example 10 | 90 | 120 | 16 |
| Example 11 | 90 | 110 | 16 |
| Example 12 | 91 | 124 | 16 |
| Example 13 | 89 | 125 | 16 |
| Example 14 | 91 | 136 | 16 |
| Example 15 | 92 | 130 | 16 |
| Example 16 | 90 | 137 | 16 |
| Example 17 | 91 | 132 | 16 |
| Example 18 | 89 | 132 | 16 |
| Example 19 | 92 | 120 | 16 |
| Example 20 | 96 | 150 | 16 |
| Example 21 | 92 | 135 | 16 |
| Example 22 | 89 | 110 | 16 |
| Example 23 | 88 | 120 | 16 |
| Example 24 | 87 | 115 | 16 |
| Example 25 | 89 | 105 | 16 |
| Example 26 | 90 | 108 | 16 |
| Example 27 | 92 | 95 | 16 |
| Comparative Example 1 | 68 | 275 | 16 |
| Comparative Example 2 | 67 | 280 | 16 |
| Comparative Example 3 | 72 | 265 | 16 |
| Comparative Example 4 | 70 | 360 | 16 |
| Comparative Example 5 | 73 | 370 | 16 |
| Comparative Example 6 | 71 | 370 | 16 |
| Comparative Example 7 | 66 | 240 | 16 |
| Comparative Example 8 | 65 | 355 | 16 |
| Comparative Example 9 | 68 | 370 | 16 |

As shown in Table 2, the photosensitive resin compositions of Examples 1 to 27 having the solvent composition according to one embodiment exhibit improved sensitivity, film residue ratio, and film shrinkage ratio, while the photosensitive resin compositions according to Comparative Examples 1 to 9 having no solvent composition according to one embodiment exhibit insufficient coating property and largely deteriorated film residue ratio and sensitivity.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

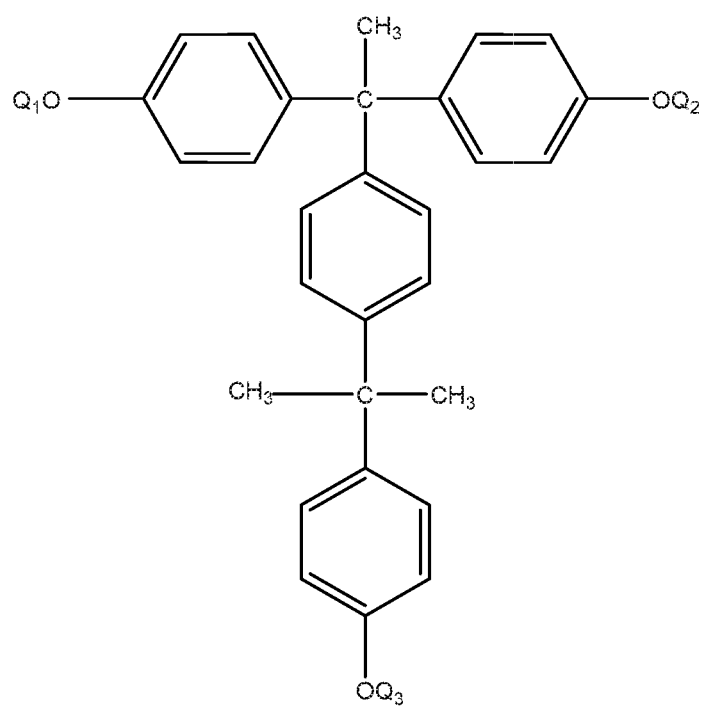

What is claimed is:

1. A positive photosensitive resin composition, comprising:
    (A) an alkali soluble resin;
    (B) a photosensitive diazoquinone compound;
    (C) a phenol compound;
    (D) a thermal acid generator; and
    (E) a solvent, and
    wherein the solvent comprises an organic solvent having a boiling point of less than about 160° C. under an atmospheric pressure and an organic solvent having a boiling point of greater than or equal to about 160° C. under an atmospheric pressure,
    wherein the organic solvent having a boiling point of less than about 160° C. is included in an amount of greater than or equal to about 95 wt % and less than about 100 wt % based on the total amount of the solvent, and
    the organic solvent having a boiling point of greater than or equal to about 160° C. is included in an amount of greater than about 0 wt % and less than or equal to about 5 wt % based on the total amount of the solvent.

2. The positive photosensitive resin composition of claim 1, wherein the solvent comprises the organic solvent having a boiling point of less than about 160° C. under an atmospheric pressure and the organic solvent having a boiling point of greater than or equal to about 160° C. under an atmospheric pressure in a ratio of about 95:5 to about 99.5:0.5.

3. The positive photosensitive resin composition of claim 1, wherein the solvent comprises an organic solvent having a boiling point of greater than or equal to about 100° C. and less than about 160° C. and an organic solvent having a boiling point of greater than or equal to about 160° C. and less than 280° C.

4. The positive photosensitive resin composition of claim 1, wherein the alkali soluble resin comprises a polybenzoxazole precursor, a polyimide precursor, or a combination thereof.

5. The positive photosensitive resin composition of claim 4, wherein the polybenzoxazole precursor comprises a structural unit represented by the following Chemical Formula 1, and the polyimide precursor comprises a structural unit represented by the following Chemical Formula 2:

[Chemical Formula 1]

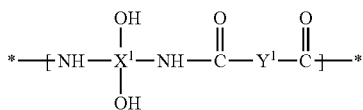

[Chemical Formula 2]

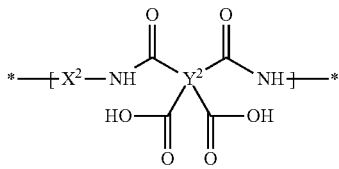

wherein, in the above Chemical Formulae 1 and 2, each $X^1$ is the same or different and each is independently a substituted or unsubstituted C6 to C30 aromatic organic group, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

6. The positive photosensitive resin composition of claim 1, wherein the positive photosensitive resin composition comprises:
about 5 to about 100 parts by weight of the photosensitive diazoquinone compound (B);
about 1 to about 30 parts by weight of the phenol compound (C);
about 1 to about 50 parts by weight of the thermal acid generator (D); and
about 100 to about 2000 parts by weight of the solvent (E), each based on about 100 parts by weight of the alkali soluble resin (A).

7. The positive photosensitive resin composition of claim 1, further comprising a surfactant, a leveling agent, a silane coupling agent, or a combination thereof.

8. A photosensitive resin film manufactured using the positive photosensitive resin composition of claim 1, wherein the photosensitive resin film is manufactured by the steps of:
coating the positive photosensitive resin composition of claim 1 on a supporting substrate;
drying the coated positive photosensitive resin composition of claim 1 to form a positive photosensitive resin composition layer;
exposing the positive photosensitive resin composition layer; and
developing the positive photosensitive resin composition layer in an alkali aqueous solution to provide a photosensitive resin film.

9. A display device comprising the photosensitive resin film of claim 8.

* * * * *

UNITED STATES PATENT AND TRADEMARK OFFICE
CERTIFICATE OF CORRECTION

PATENT NO. : 9,323,147 B2
APPLICATION NO. : 14/445823
DATED : April 26, 2016
INVENTOR(S) : Jong-Hwa Lee et al.

It is certified that error appears in the above-identified patent and that said Letters Patent is hereby corrected as shown below:

In the Specification

Column 9, Line 11 reads: "$A^1$ is a single bond, 0, CO, $CR^{47}R^{48}$, $SO_2$ or S, wherein the"
and should read: "$A^1$ is a single bond, O, CO, $CR^{47}R^{48}$, $SO_2$ or S, wherein the"

Column 12, Line 26 reads: "dently OQ to wherein Q is the same as defined in the above"
and should read: "dently OQ wherein Q is the same as defined in the above"

Column 12, Chemical Formula 21 is depicted as:

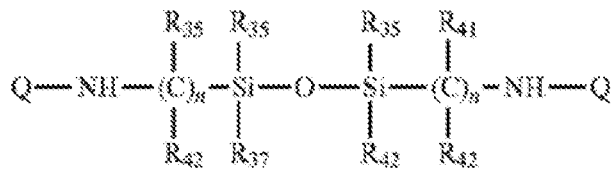

and should be depicted as:

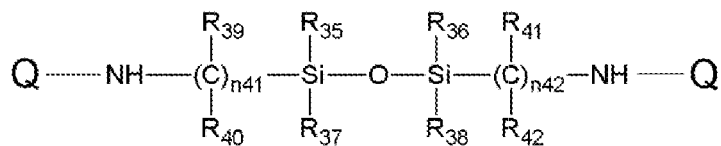

Signed and Sealed this
Twenty-sixth Day of July, 2016

Michelle K. Lee
*Director of the United States Patent and Trademark Office*

CERTIFICATE OF CORRECTION (continued)
U.S. Pat. No. 9,323,147 B2

In the Specification

Column 20, Chemical Formula A is depicted as:

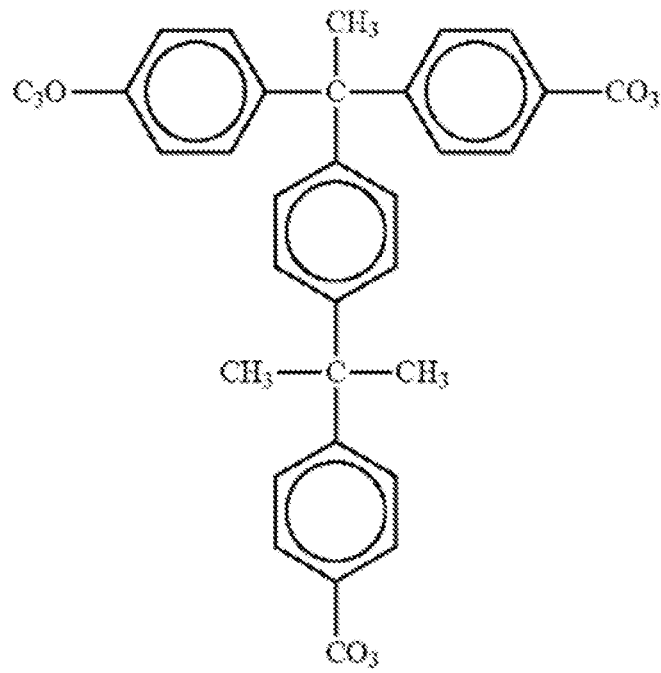

and should be depicted as: